(12) United States Patent
Yan

(10) Patent No.: US 9,899,085 B1
(45) Date of Patent: Feb. 20, 2018

(54) NON-VOLATILE FESRAM CELL CAPABLE OF NON-DESTRUCTIVE READ OPERATIONS

(71) Applicant: AUCMOS Technologies USA, Inc., Santa Clara, CA (US)

(72) Inventor: Tianhong Yan, Saratoga, CA (US)

(73) Assignee: AUCMOS TECHNOLOGIES USA, INC., Santa Clara, CA (US)

( * ) Notice: Subject to any disclaimer, the term of this patent is extended or adjusted under 35 U.S.C. 154(b) by 0 days.

(21) Appl. No.: 15/393,585

(22) Filed: Dec. 29, 2016

(51) Int. Cl.
*G11C 11/22* (2006.01)
*G11C 14/00* (2006.01)

(52) U.S. Cl.
CPC .......... *G11C 14/0072* (2013.01); *G11C 11/22* (2013.01); *G11C 11/221* (2013.01)

(58) Field of Classification Search
CPC ... G11C 11/22; G11C 11/221; G11C 14/0072; G11C 11/5657; H01L 27/11502
USPC ............ 365/145, 156, 154, 189.09
See application file for complete search history.

(56) References Cited

U.S. PATENT DOCUMENTS

| 8,472,236 | B2* | 6/2013 | Summerfelt | G11C 11/22 365/145 |
| 9,093,168 | B2* | 7/2015 | Kawashima | G11C 11/412 |
| 2005/0121789 | A1* | 6/2005 | Madurawe | H01L 27/0207 257/758 |
| 2005/0190597 | A1* | 9/2005 | Kato | G11C 11/22 365/185.08 |

* cited by examiner

*Primary Examiner* — David Lam
(74) *Attorney, Agent, or Firm* — VLP Law Group, LLP; Edward C. Kwok, Esq.

(57) ABSTRACT

A FeSRAM cell includes (a) first and second inverters between a power supply voltage and a ground reference cross-coupled to each other, the first and second cross-coupled inverters providing first and second data terminals; (b) first and second select transistors respectively coupled to the first and second data terminals to control access to the first second data terminals; and (c) first and second ferroelectric capacitors coupled between a first plate line and respectively the first and second data terminals, the first plate line receiving a negative programming voltage having a magnitude greater than the power supply voltage to allow programming one of the first and second ferroelectric capacitors into a first non-volatile programmed state.

8 Claims, 12 Drawing Sheets

NON-VOLATILE FESRAM CELL CAPABLE OF NON-DESTRUCTIVE READ OPERATIONS

BACKGROUND OF THE INVENTION

1. Field of the Invention

The present invention relates to non-volatile memory circuits. In particular, the present invention relates to non-volatile memory circuits that use ferroelectric material for persistent storage.

2. Discussion of the Related Art

Memory circuits using ferroelectric materials (e.g., lead zirconate Titanate (PZT)) have been proposed. One type of such memory circuit is simply a capacitor, such as that ferroelectric capacitor 100 of FIG. 1(c). As shown in FIG. 1(c), ferroelectric capacitor 100 includes a layer of ferroelectric material provided between two capacitor plates represented by electrodes formed between a "plate line" (PL) and a "bit line" (BL), respectively.

Ferroelectric capacitor 100 of FIG. 1(c) may be used in one of two ways: (i) as non-volatile memory cell, or as (ii) a volatile memory cell. FIG. 1(a) illustrates the non-volatile programmed states of ferroelectric capacitor 100 when used as a non-volatile memory cell. As shown in FIG. 1(a), when used as a non-volatile memory cell, a high programming voltage (e.g., $V_{PP}$, where $V_{PP}$ may be 5 volts) is applied across ferroelectric capacitor 100 to program ferroelectric capacitor 100 into a first phase or programmed state, representing the stored data bit "0". After the imposed voltage across ferroelectric capacitor 100 is removed, the ferroelectric material in ferroelectric capacitor 100 maintains the programmed "0" state for a long time (e.g., tens of years). Alternatively, ferroelectric capacitor 100 may be programmed into a second phase or programmed state by applying a high negative voltage (e.g., $-V_{PP}$) across ferroelectric capacitor 100, representing the erased data bit "1". When the imposed voltage across capacitor 100 is removed, the ferroelectric material in storage capacitor 100 maintains the programmed "1" state for a long time (e.g., tens of years).

FIG. 1(b) illustrates the programmed states of ferroelectric capacitor 100 when used as a volatile memory cell. As shown in FIG. 1(b), when used as a volatile memory cell, a programming voltage (e.g., $V_{cc}$ such as 1.2 volts) that is much lower than the programming voltage for a non-volatile programmed state is applied across ferroelectric capacitor 100 to program ferroelectric capacitor 100 into a first phase or programmed state, representing the volatile data bit "0". When the imposed voltage across ferroelectric capacitor 100 is removed, the ferroelectric material in ferroelectric capacitor 100 maintains the programmed "0" state for a relatively much shorter time period (e.g., seconds) than those of the non-volatile states. Alternatively, ferroelectric capacitor 100 may be programmed into a second phase or programmed state by applying a corresponding negative voltage ($-V_{cc}$) across storage capacitor 100, representing the volatile data bit "1". When the imposed voltage across ferroelectric capacitor 100 is removed, the ferroelectric material in ferroelectric capacitor 100 maintains the programmed "1" state for a relatively shorter period of time (e.g., seconds) than those of the non-volatile states.

The higher programming voltage in non-volatile memory cells operation may reduce the endurance of ferroelectric capacitor 100 and provides relatively slow read and write speeds. The low programming voltage for volatile operations allows greater endurance and higher read and write speeds (e.g., comparable to conventional dynamic random access memory (DRAM) speeds). However, in many applications, as in DRAM, ferroelectric capacitor 100 is required to be refreshed periodically to prevent data loss, albeit at a lesser frequency than conventional DRAMs.

FIG. 2(a) shows a ferroelectric static random access memory (FeSRAM) cell 200, which operates as a non-volatile memory cell. As shown in FIG. 2(a), FeSRAM cell 200 includes a conventional 6-transistor static random access memory (SRAM) cell formed by select transistors 201a and 201b, and cross-coupled inverters formed by transistors 202a, 202b, 203a and 203b. FeSRAM 200 also includes ferroelectric capacitors C0 and C1 respectively connected to data terminals 204a and 204b of the cross-coupled inverters and the plate line carrying voltage signal PL. During operation, before FeSRAM cell is powered down, the complementary stored data bits of the SRAM cell held at data terminals 204a and 204b are written into ferroelectric capacitors C0 and C1, respectively. When power is restored, the complementary data bits in ferroelectric storage capacitors C0 and C1 are restored to the SRAM cell (i.e., to be held at data terminals 204a and 204b again).

FIG. 2(b) shows, when power is restored, voltage signal VPW at the power supply line of the SRAM cell, voltage signal PL on the plate line and voltage signals BT and BC at data terminals 204a and 204b of the cross-coupled inverters of the SRAM cell. FIG. 2(c) shows, before FeSRAM cell 200 is powered down, voltage signal VPW at the power supply line of the included SRAM circuit, plate line signal PL on the plate line and data signals BT and BC at the data terminals of the cross-coupled inverters of the SRAM cell.

Initially, as shown in FIG. 2(c), voltage signal VPW is at $V_{CC}$, plate line signal PL is at 0.5 $V_{CC}$, and data signals BT and BC are at $V_{CC}$ and 0 volts, respectively. (Transistors 203a and 202b are conducting, and transistors 203b and 202a are non-conducting). To write these states into ferroelectric capacitors C0 and C1, both voltage signals VPW and PL are brought to programming voltage $V_{PP}$, thereby bringing the voltage across ferroelectric storage capacitor C1 to $V_{PP}$, thus writing bit '0' into capacitor C1. After ferroelectric capacitor C1 has been written, voltage PL on the plate line is brought to 0 volts, such that the voltage across ferroelectric storage capacitor C0 is brought to $-V_{PP}$, thereby writing bit '1' into capacitor C0. After ferroelectric storage capacitors C0 and C1 are both written, voltage VPW is also brought to 0 volts (i.e., powered down).

When power is restored, as shown in FIG. 2(b), voltage signal VPW is ramped up to $V_{CC}$, plate line signal PL is held at 0 volts. The stored charges in ferroelectric storage capacitors C0 (at bit '1') and C1 (at bit '0') are sufficient to render transistors 203a and 202b conducting, and transistors 203b and 202a non-conducting. Accordingly, data signals BT and BC at data terminals 204a and 204b are brought to $V_{CC}$ and 0 volts, respectively. Thus, the included SRAM circuit is returned to its state prior to the power down. At this point, plate line voltage PL is returned to 0.5 $V_{PP}$, which is its quiescent state. The subsequent operations of FeSRAM cell 200 are essentially those of a conventional SRAM cell.

As can be seen from the discussion above with respect to FIGS. 1(a) and 1(b), during normal operations, signal transitions at the data terminals of the cross-coupled inverters of the included SRAM circuit place ferroelectric capacitors C0 and C1 into their volatile states, and thus the resulting stored data are not preserved. In certain applications, it is desirable that the non-volatile programmed states of ferroelectric capacitors C0 and C1 of the FeSRAM cell be kept after power has been restored and regular operations are carried out in the included SRAM circuit. Keeping the non-volatile programmed states allow the system to return to a known state after power-up. FIG. 3 shows FeSRAM cell 300 which allows the non-volatile programmed states of ferroelectric capacitors C0 and C1 be kept after power has been restored and regular operations are carried out in the included SRAM circuit.

As shown in FIG. 3, FeSRAM cell 300 differs from FeSRAM cell 200 of FIG. 2(a) by including access transistors S0 and S1, which are controlled by control signal WT. Control signal WT renders access transistors S0 and S1 conducting only during the time when the signals on data terminals 204a and 204b are written into ferroelectric capacitors C0 and C1, or during the time when the non-volatile programmed states of Ferroelectric capacitors C0 and C1 are used to restore the data signals on terminals 204a and 204b upon power-up. During regular operations of the included SRAM circuit, control signal WT keeps transistors S0 and S1 both in a high-impedance state, so that signals transitions at data terminals 204a and 204b would not place ferroelectric capacitors C0 and C1 into volatile states. Accordingly, FeSRAM cell 300 is a non-destructive FeSRAM cell.

One disadvantage of FeSRAM 300 results from the fact that ferroelectric capacitors C0 and C1 receive non-volatile programming voltages $V_{PP}$ through transistors 203a and 203b of the included SRAM circuit. Non-volatile programming voltage $V_{PP}$ is typically greater than 3.5 volts, while power supply voltage $V_{CC}$ of the included SRAM circuit during regular operations may be considerably lower (e.g., 1.2 volts). To support the write operations on ferroelectric capacitors C0 and C1, the conventional SRAM transistors (i.e., transistors 201a, 201b, 202a, 202b, 203a and 203b) have to be designed to withstand the stress of the higher non-volatile programming voltages of the ferroelectric capacitors. As a result, FeSRAM cells 200 and 300 have to be implemented with significantly larger circuit elements than conventional SRAM circuits, and thus cannot achieve the data densities of conventional SRAM arrays.

SUMMARY

According to one embodiment of the present invention, a FeSRAM cell includes: (a) first and second inverters between a power supply voltage and a ground reference cross-coupled to each other, the first and second cross-coupled inverters providing first and second data terminals; (b) first and second select transistors respectively coupled to the first and second data terminals to control access to the first second data terminals; and (c) first and second ferroelectric capacitors coupled between a first plate line and respectively the first and second data terminals, the first plate line receiving a negative programming voltage having a magnitude greater than the power supply voltage to allow programming one of the first and second ferroelectric capacitors into a first non-volatile programmed state. In one embodiment, the first plate line also receives a positive programming voltage based on a switching arrangement to program the other one of the first and second ferroelectric capacitors to a second non-volatile programmed state. Each of the first and second ferroelectric capacitors may be implemented between interconnect conductor lines routed above one the first and second select transistors. The FeSRAM cell may include first and second access transistors coupling the first and second ferroelectric capacitors to the first and second data terminals of the cross-coupled inverters, respectively.

According to one embodiment of the present invention, the FeSRAM cell may further include third and fourth ferroelectric capacitors coupled between a second plate line and respectively first and second data terminals of the cross-coupled inverters, the second plate line receiving a positive programming voltage. Under this arrangement, no programming voltage switching needs to be implemented in either the first or the second plate lines. The first and the third ferroelectric capacitors may be implemented between interconnect conductor lines routed above the first select transistor and the second and the fourth ferroelectric capacitors may be implemented between interconnect conductor lines routed above the second select transistor. Under this arrangement, a first access transistor may couple the first and the third ferroelectric capacitors each to the first data terminal of the cross-coupled inverters and a second access transistor may couple the second and the fourth ferroelectric capacitors each to the second data terminal of the cross-coupled inverters. In one embodiment, each of the first and second access transistors may be implemented as a thin film transistor coupling between a source region of one of the select transistors and a common capacitor plate of the corresponding ferroelectric capacitors.

The present invention is better understood upon consideration of the detailed description below, in conjunction with the accompanying drawings.

BRIEF DESCRIPTION OF THE DRAWINGS

To facilitate cross-referencing and to simplify the detailed description below, like elements in the figures are assigned like reference numerals.

DETAILED DESCRIPTION OF THE PREFERRED EMBODIMENTS

Figure 4A:
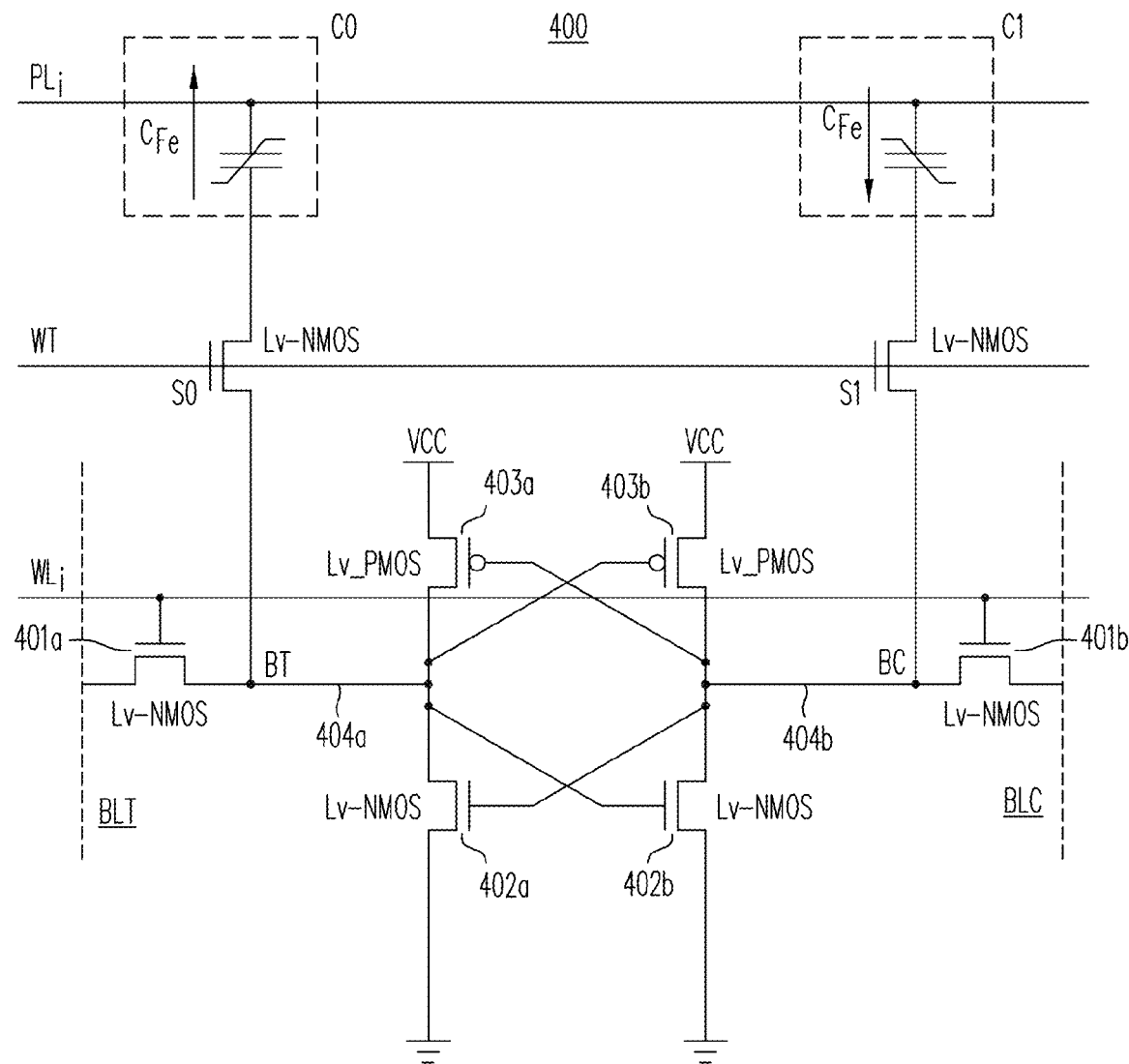
FIG. 4(a) shows FeSRAM 400, in accordance with one embodiment of the present invention.

The present invention provides FeSRAM cells in which the non-volatile programming voltages of the ferroelectric capacitors are not imposed across the transistors of the included SRAM circuit. Consequently, low-voltage transistors can be used to implement the transistors of the included SRAM circuit of the FeSRAM cell, thereby allowing the FeSRAM to have comparable footprint as a conventional SRAM cell. FIG. 4(a) shows FeSRAM 400, in accordance with one embodiment of the present invention.

Figure 1A:
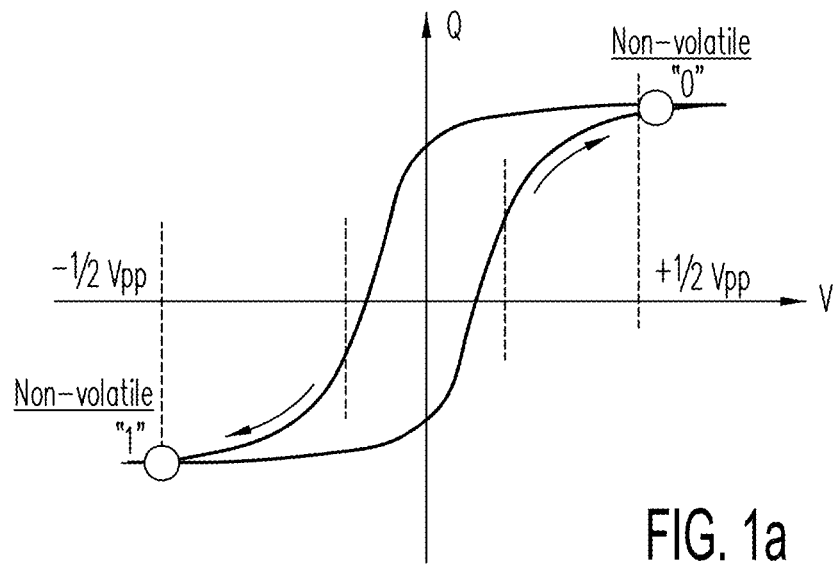
FIG. 1(a) illustrates the non-volatile programmed states of ferroelectric capacitor 100 when used as a non-volatile memory circuit.
Figure 1B:
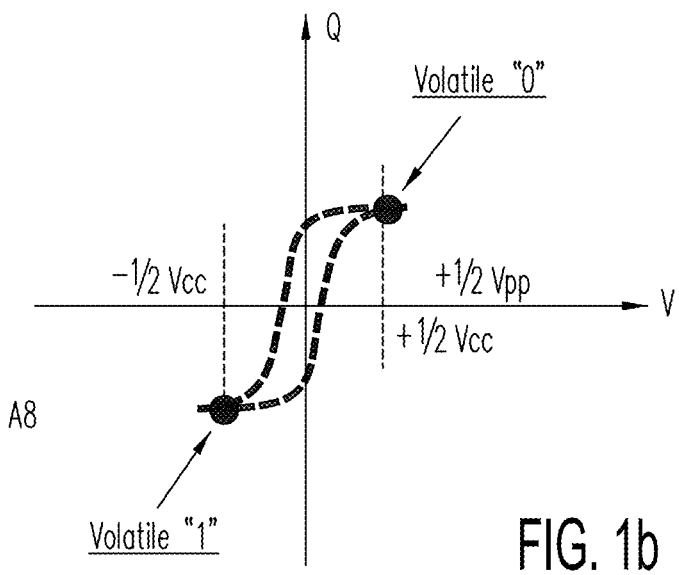
FIG. 1(b) illustrates the volatile programmed states of ferroelectric capacitor 100 when used as a volatile memory circuit
Figure 1C:
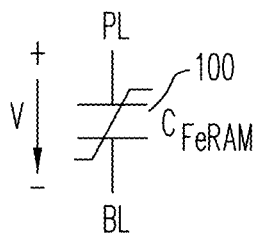
FIG. 1(c) shows ferroelectric capacitor 100, which is a simple model of a ferroelectric memory circuit.
Figure 2A:
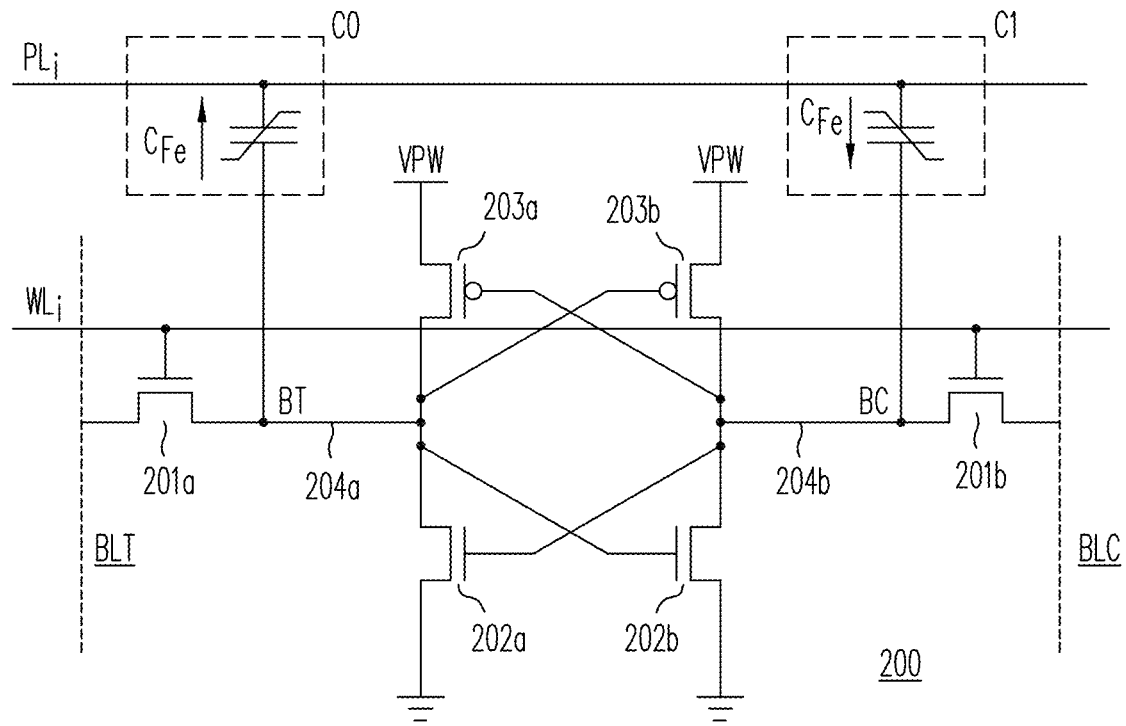
FIG. 2(a) shows a ferroelectric static random access memory (FeSRAM) cell 200, which operate as a non-volatile memory cell.
Figure 2B:
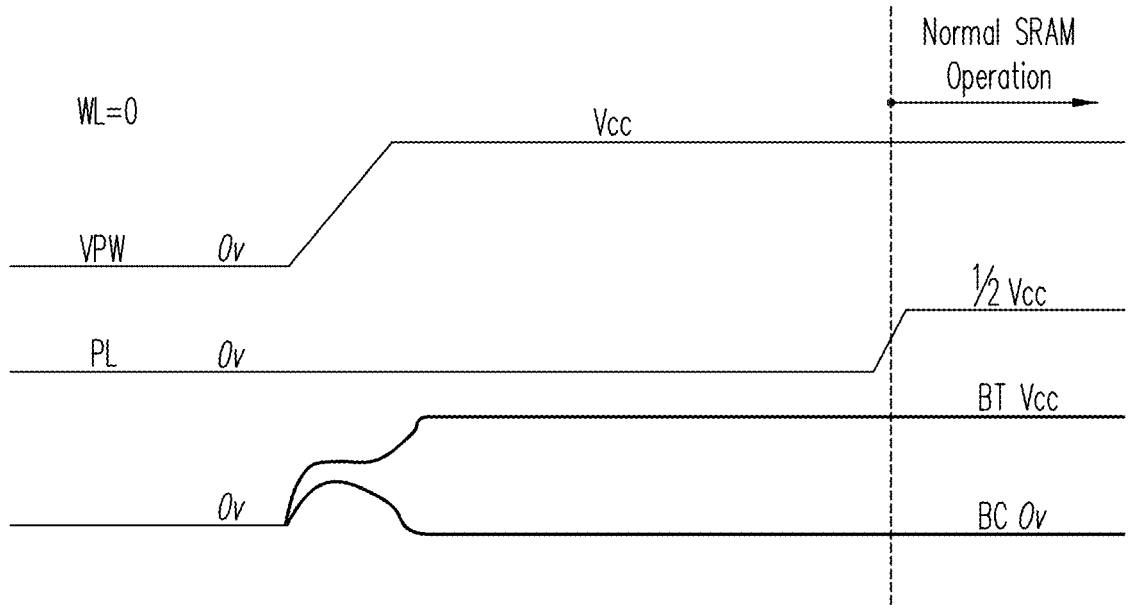
FIG. 2(b) shows, when power is restored, voltage signal VPW at the power supply line of the SRAM circuit, plate line signal PL on the plate line and data signals BT and BC at the data terminals of the cross-coupled inverters of the SRAM cell.
Figure 2C:
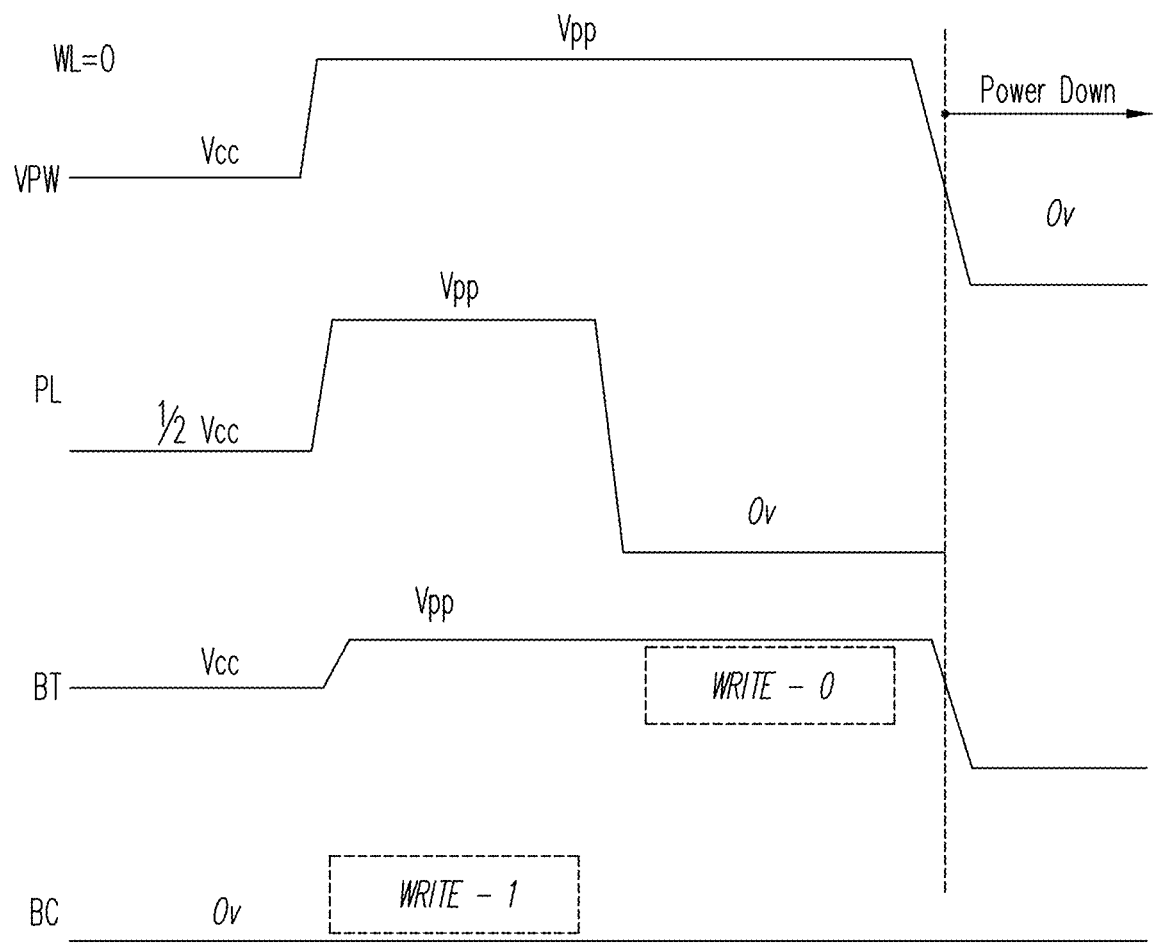
FIG. 2(c) shows, before FeSRAM cell 200 is powered down, voltage signal VPW at the power supply line of the included SRAM circuit, plate line signal PL on the plate line and data signals BT and BC at the data terminals of the cross-coupled inverters of the SRAM cell.
Figure 3:
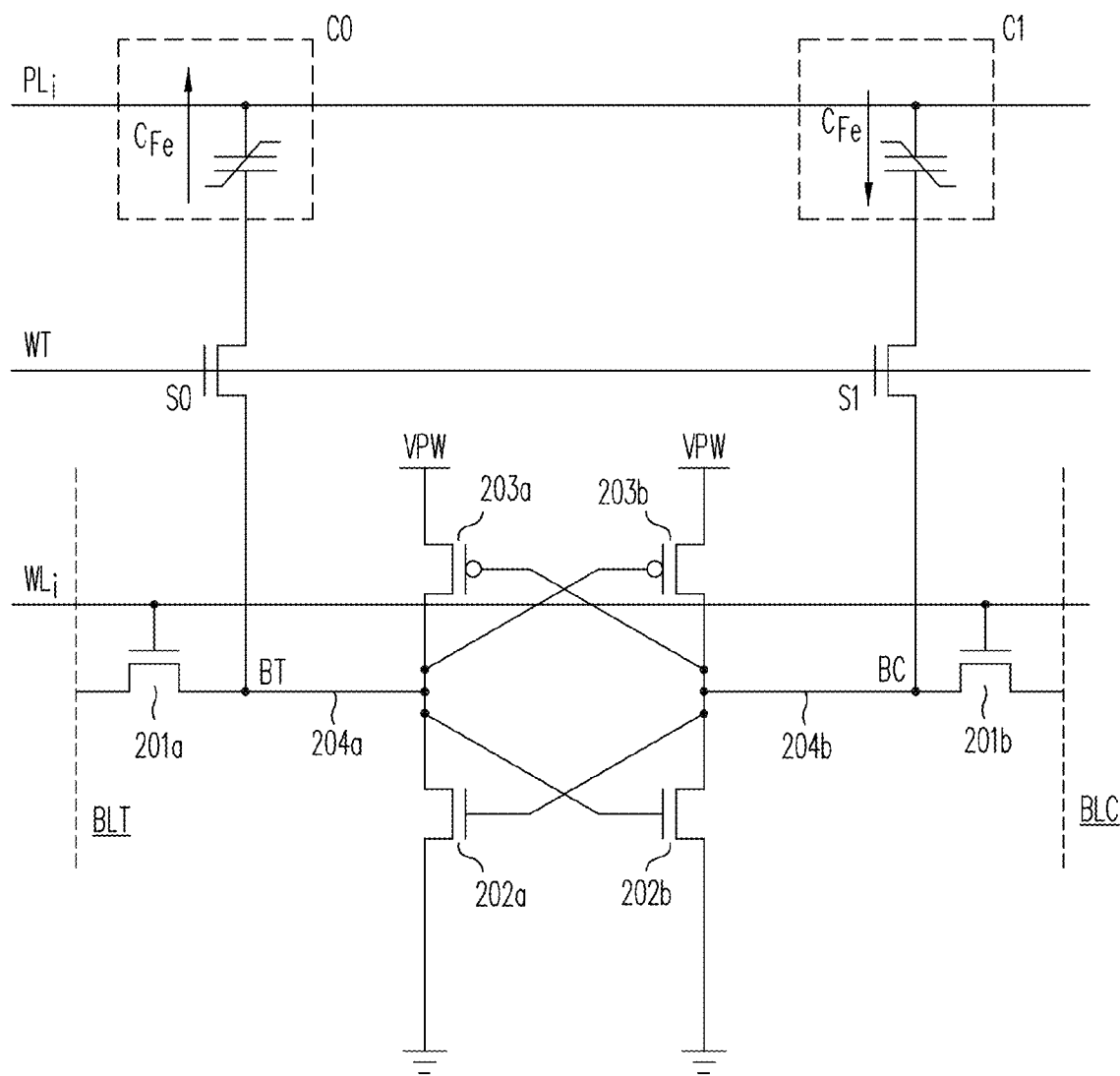
FIG. 3 shows FeSRAM cell 300 which allows the non-volatile programmed states of ferroelectric capacitors C0 and C1 be kept after power has been restored and regular operations are carried out in the included conventional SRAM circuit.
Figure 4B:
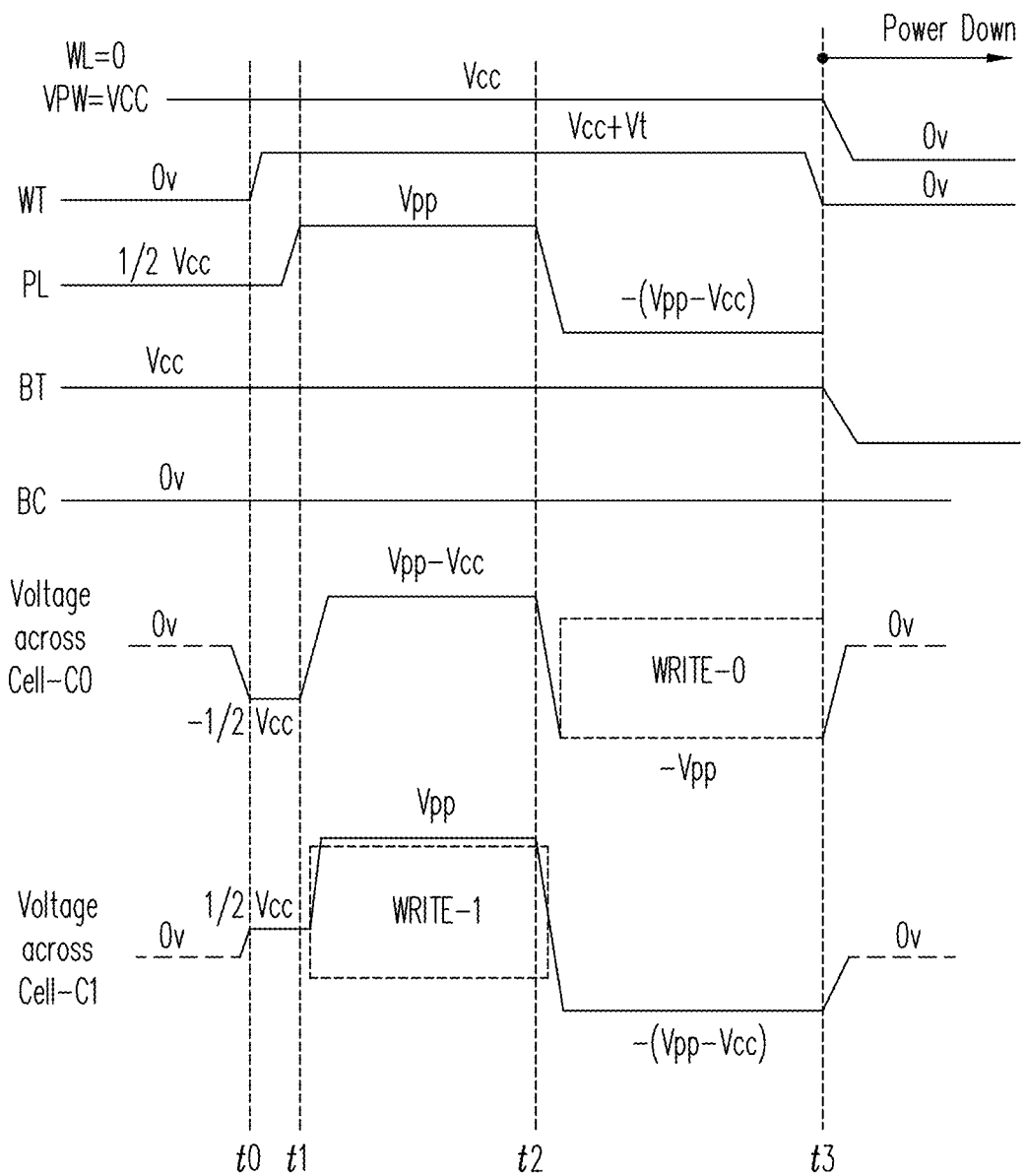
FIG. 4(b) illustrates a write operation on ferroelectric capacitors C0 and C1 of FeSRAM cell 400, showing the waveforms of access signal WT at the gate terminals of access transistors S0 and S1, plate line signal PL, data signals BT and BC at data terminals 404a and 404b, and the voltages across ferroelectric capacitors C0 and C1, in accordance with one embodiment of the present invention.

As shown in FIG. 4(a), FeSRAM cell 400 includes ferroelectric capacitors C0 and C1, access transistors S0 and S1, and transistors 401a, 401b, 402a, 402b, 403a and 403b. Transistors 401a, 401b, 402a, 402b, 403a and 403b form a conventional SRAM cell. Unlike transistors 203a and 203b of FeSRAM 300 of FIG. 3—which are connected to receive both the non-volatile programming voltage for programming ferroelectric capacitors C0 and C1 and the operating power supply voltage $V_{CC}$—transistors 403a and 403b of FeSRAM 400 are connected only to operating power supply voltage $V_{CC}$ even during the programming of ferroelectric capacitors C0 and C1. FIG. 4(b) illustrates a write operation on ferroelectric capacitors C0 and C1 of FeSRAM cell 400, showing the waveforms of access signal WT at the gate terminals of access transistors S0 and S1, plate line signal PL, data signals BT and BC at data terminals 404a and 404b, and the voltages across ferroelectric capacitors C0 and C1, in accordance with one embodiment of the present invention.

As shown in FIG. 4(b), initially, plate line signal PL is at voltage 0.5 $V_{CC}$ and access signal WT is at 0 volts, so that access transistors S0 and S1 isolate ferroelectric capacitors C0 and C1 from data signals BT and BC at data terminals 404a and 404b. In this example, data signal BT at data terminal 404a is at voltage $V_{CC}$, while data signal BC at data terminal 404b is at 0 volts, indicating that transistor 403a and 402b are conducting, and transistors 403b and 402a are not conducting. To write into ferroelectric capacitors C0 and C1, access signal WT is raised at time $t_0$ to voltage ($V_{CC}$+ Vt), where Vt is the threshold voltage for each of access transistors S0 and S1, such that ferroelectric capacitors C0 and C1 are electrically coupled to data terminals 404a and 404b, respectively. Relative to plate line signal PL, the voltage across ferroelectric capacitor C0 is $-0.5\ V_{CC}$, while the voltage across ferroelectric capacitor C1 is 0.5 $V_{CC}$. At time $t_1$, plate line signal PL is raised to non-volatile programming voltage $V_{PP}$, such that the voltage across ferroelectric capacitor C0 is ($V_{PP}-V_{CC}$), as terminal 404a is at voltage $V_{CC}$, and the voltage across ferroelectric capacitor C1 is $V_{PP}$, as data terminal 404b is at 0 volts. Ferroelectric capacitor C1 is thus programmed to the non-volatile '1" state. At time $t_2$, plate line signal PL is lowered to voltage $-(V_{PP}-V_{CC})$, such that the voltage across ferroelectric capacitor C0 is $-V_{PP}$ and the voltage across ferroelectric capacitor C1 is $-(V_{PP}-V_{CC})$. Ferroelectric capacitor C0 is thus programmed to the non-volatile '0" state. After both ferroelectric capacitors C0 and C1 are written, FeSRAM cell 400 may power down (i.e., both power supply voltage $V_{CC}$ and access signal WT may be brought to 0 volts).

In this write operation, none of transistors 401a, 401b, 402a, 402b, 403a and 403b is exposed to the high non-volatile programming voltage $V_{PP}$, and operates only between operating power supply voltage $V_{CC}$ and 0 volts. Thus, each of these transistors can be implemented using low-voltage transistors (i.e., those transistors that need not be designed to withstand the stress of the high non-volatile programming voltage $V_{PP}$).

Figures 4C, 4D:
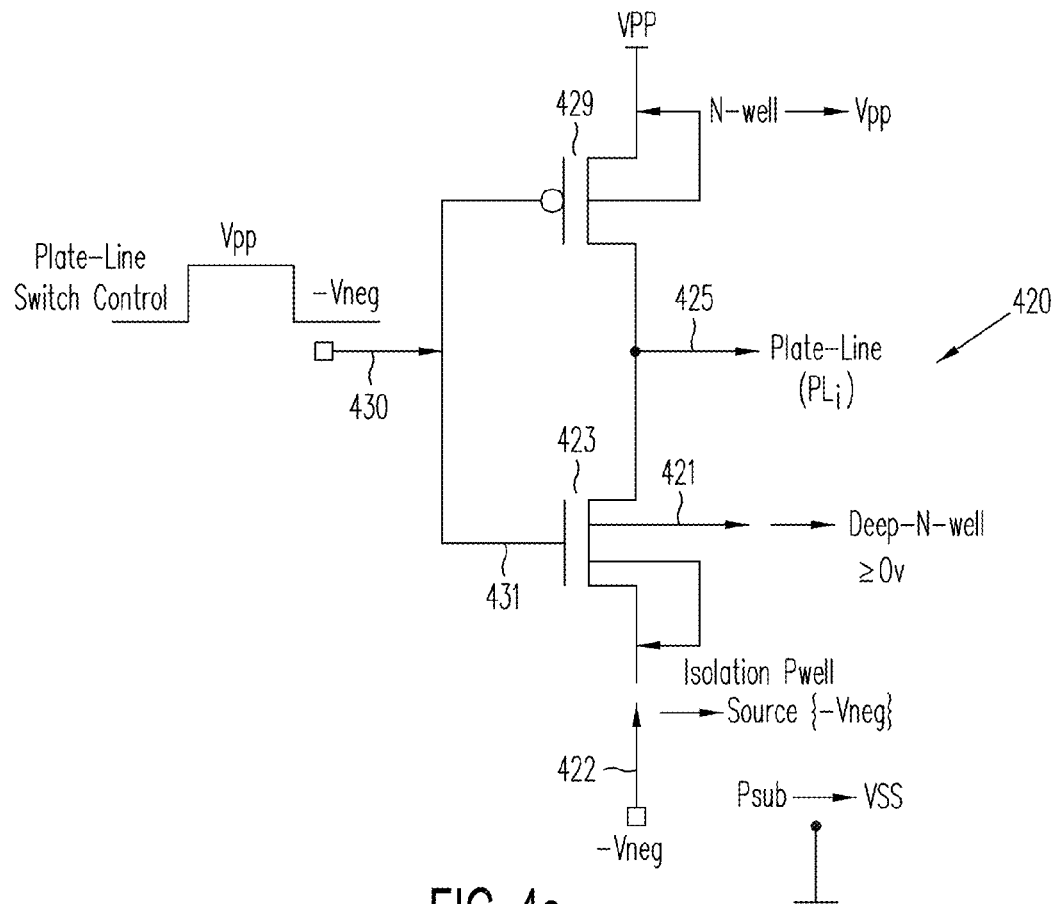
FIG. 4(c) is a schematic diagram showing plate line signal generator 420 that provides the voltages on the plate line of FeSRAM cell 400, according to one embodiment of the present invention.
FIG. 4(d) shows one implementation of NMOS transistor 423 of plate line signal generator 420, in accordance with one embodiment of the present invention.

FIG. 4(c) is a schematic diagram showing plate line signal generator 420 for providing the voltages on the plate line, especially the negative programming voltage, according to one embodiment of the present invention. In one embodiment, plate line signal generator 420 may be provided on a P⁻ type substrate. As shown in FIG. 4(c), plate line signal generator 420 includes PMOS transistor 429 and NMOS transistor 423. During programming of ferroelectric capacitors C0 and C1, under control of plate line switch control signal 430, plate line signal PL receives either programming voltage $V_{PP}$ from PMOS transistor 429 or a negative voltage $-V_{neg}$ (e.g., voltage $-(V_{PP}-V_{CC})$) from NMOS transistor 423. PMOS transistor 429, which may be implemented in an N-well in the P⁻ substrate, provides voltage $V_{PP}$ between times $t_1$ and $t_2$, as discussed above. NMOS transistor 423, while provides the negative programming voltage $-V_{neg}$ between times $t_2$ and $t_3$, however, should be implemented in a P-well that is provided in a deep N-well of the P⁻ substrate, such as shown in FIG. 4(d).

FIG. 4(d) shows one implementation of NMOS transistor 423 of plate line signal generator 420, in accordance with one embodiment of the present invention. As shown in FIG. 4(d), NMOS transistor 423 is formed in isolation P-well 424, which is provided in deep N-well 426 of the P⁻ substrate 428. During programming of ferroelectric capacitors C0 and C1, negative voltage $-V_{neg}$ is generated by a negative charge pump (not shown) and is provided to source region 422 of NMOS transistor 423. Deep N-well region 421 is biased to a positive voltage, so that deep N-well 421 provides a reversed bias PN junction to isolate isolation P-well 424 from other circuits in the P⁻ substrate. Gate terminal 431 of NMOS transistor 430 is provided a voltage that turns off PMOS transistor 429 and turns on NMOS transistor 430, such that negative voltage $-V_{neg}$ at source region 422 is provided as plate line signal PL at drain terminal 425 of NMOS transistor 423.

Figure 5A:
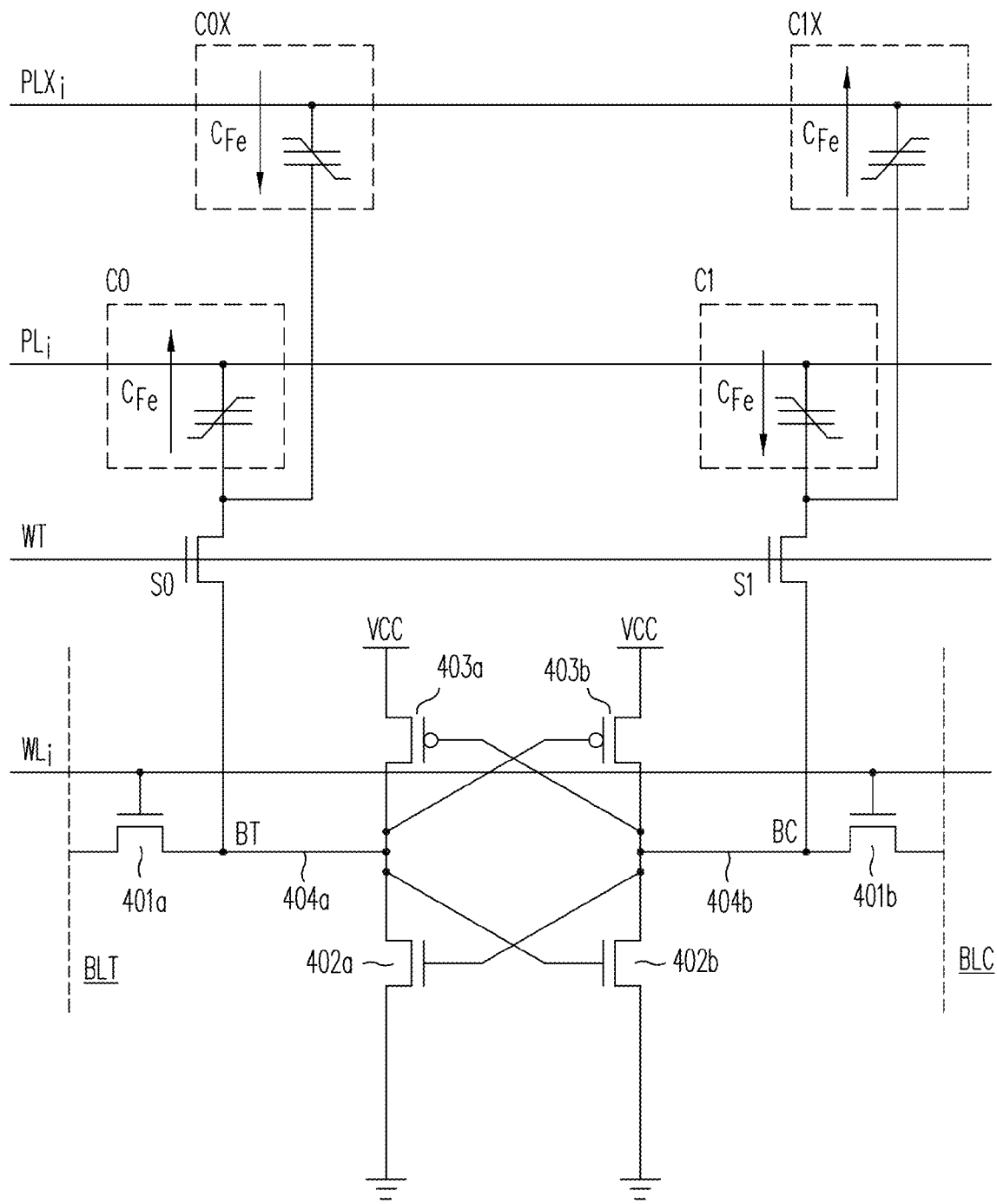
FIG. 5(a) shows FeSRAM cell 500, which can be programmed without plate line signal PL switching between positive and negative programming voltages, in accordance with one embodiment of the present invention.

When programming voltage $V_{PP}$ is greater than twice the operating power supply voltage $V_{CC}$, a program disturb condition may occur at either ferroelectric capacitors C0 and C1, as a result of the switching between the positive and negative programming voltages in plate line signal PL. FIG. 5(a) shows FeSRAM cell 500, which can be programmed without plate line signal PL switching between positive and negative programming voltages, in accordance with one embodiment of the present invention. As shown in FIG. 5(a), relative to FeSRAM 400 of FIG. 4, FeSRAM cell 500 includes additional plate line signal PLX on a second plate line, and additional ferroelectric capacitors C0X and C1X. Ferroelectric capacitors C0X and C1X are coupled between the second plate line (i.e., the plate line carrying plate line signal PLX) and respective drain terminals of access transistors S0 and S1. In FeSRAM 500, non-volatile programmed states are programming into one of ferroelectric capacitors C0 and C0X and one of ferroelectric capacitors C1 and C1X.

Figure 5B:
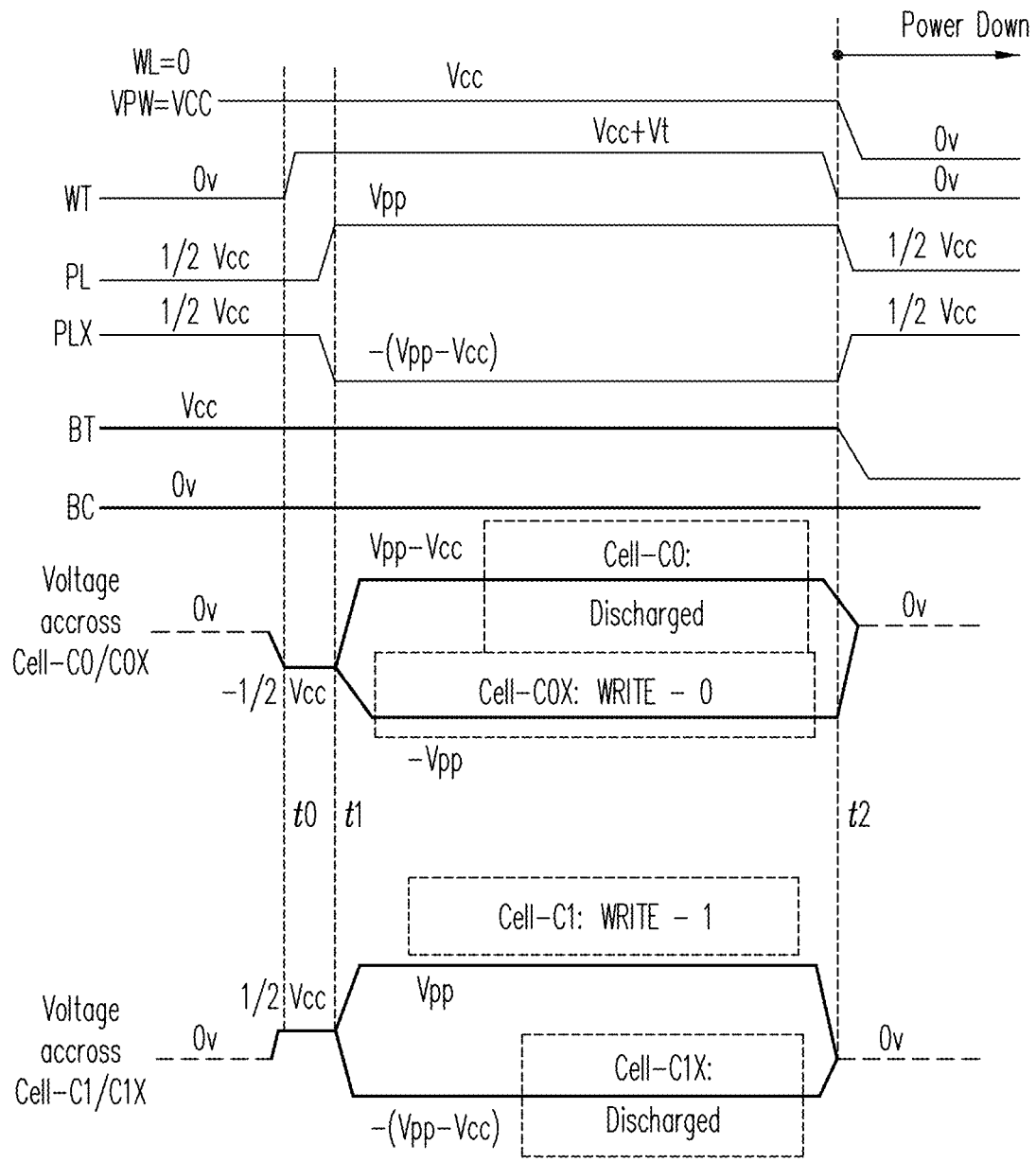
FIG. 5(b) illustrates a write operation on ferroelectric capacitors C0, C0X, C1 and C1X of FeSRAM cell 500, showing the waveforms of access signal WT at the gate terminals of access transistors S0 and S1, plate line signals PL and PLX, signals BT and BC at data terminals 404a and 404b, and the voltages across ferroelectric capacitors C0, C0X, C1 and C1X, in accordance with one embodiment of the present invention.

FIG. 5(b) illustrates a write operation on ferroelectric capacitors C0, C0X, C1 and C1X of FeSRAM cell 500, showing the waveforms of access signal WT at the gate terminals of access transistors S0 and S1, plate line signals PL and PLX, data signals BT and BC at data terminals 404a and 404b, and the voltages across ferroelectric capacitors C0, C0X, C1 and C1X, in accordance with one embodiment of the present invention. As shown in FIG. 5(b), during regular operations (e.g., prior to time $t_0$), plate lines signals PL and PLX are each kept at voltage 0.5 $V_{CC}$, and access transistors S0 and S1 are each kept at non-conducting. To initiate programming of the ferroelectric capacitors, access transistors S0 and S1 are turned on by raising access signal WT to ($V_{CC}$+Vt) at time $t_0$. At time $t_1$, rather than having plate line signal PL switch between programming voltage $V_{PP}$ and negative voltage $-(V_{PP}-V_{CC})$, these voltages are imposed on plate line signals PL and PLX, respectively, between times $t_1$ and $t_2$. In this example, data signals BT and BC at data terminals 404a and 404b are at operating power supply voltage $V_{CC}$ and ground voltage respectively. Under this condition, between times $t_1$ and $t_2$, the voltages across ferroelectric capacitors C0 and C0X are ($V_{PP}-V_{CC}$) and $-V_{PP}$, respectively. At the same time, the voltages across ferroelectric capacitors C1 and C1X are $V_{PP}$ and $-(V_{PP}-V_{CC})$, respectively. Consequently, ferroelectric capacitors C0X are C1 are placed into non-volatile programmed states "0" and "1", respectively; ferroelectric capacitors are placed into volatile programming states and becomes discharged shortly. If data signals BT and BC at data terminals 404a and 404b, respectively, were at operating ground voltage and operating power supply voltage $V_{CC}$, respectively, ferroelectric capacitors C0 and C1X would have been placed in non-volatile programming states "1" and "0", respectively, and ferroelectric capacitors C1 and C0X would become discharged. Using two plate lines in FeSRAM cell 500, the ferroelectric capacitors in non-volatile programmed states would not experience program disturb as a result of a plate line signal switching between positive and negative programming voltages. As in FeSRAM cell 400, the transistors in the included conventional SRAM of FeSRAM cell 500 can all be implemented using low-voltage transistors, thus FeSRAM cell 500 may have the advantage of substantially the same silicon footprint as a conventional SRAM circuit.

Figure 6A:
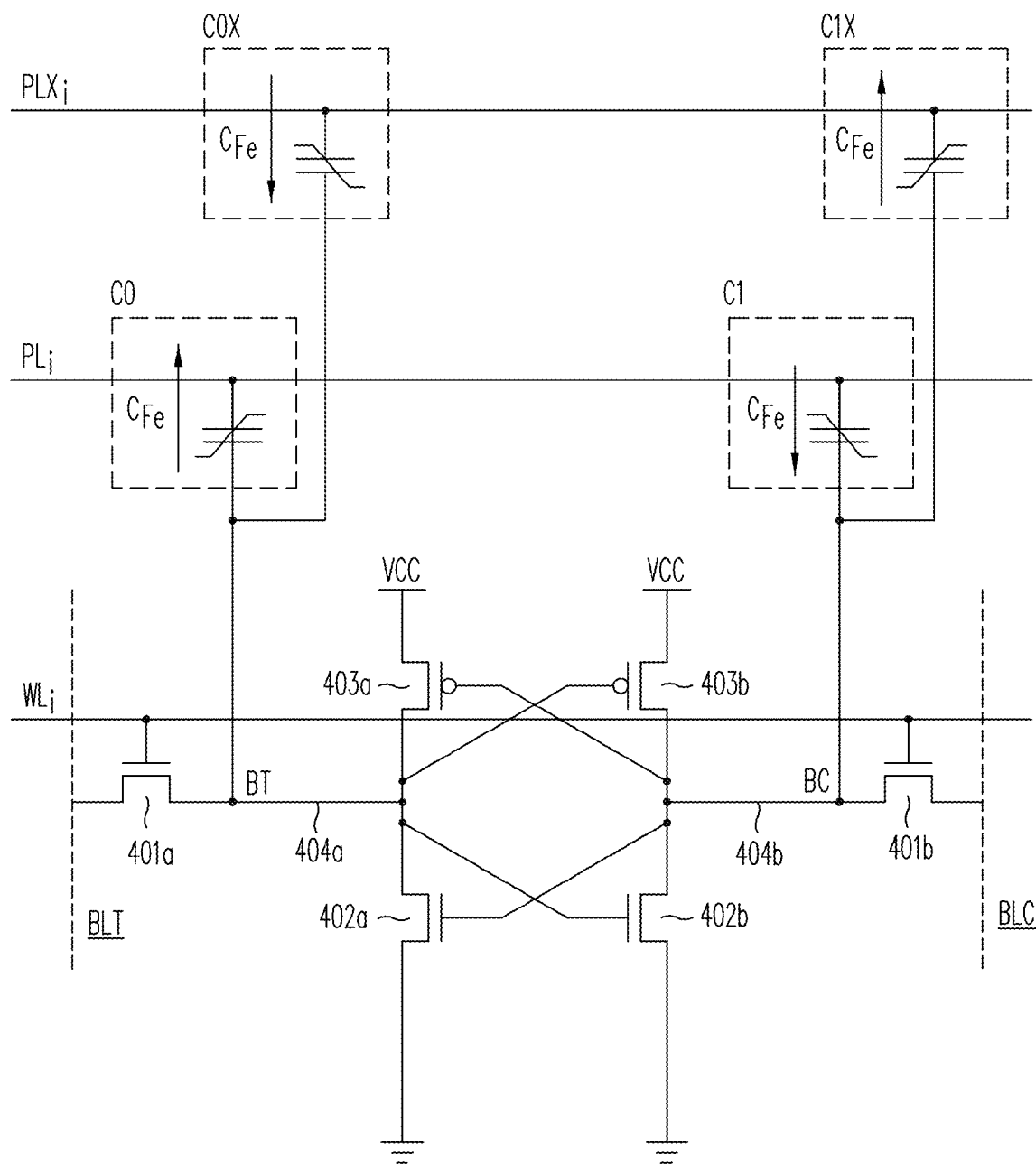
FIG. 6(a) shows FeSRAM cell 600 without access transistors, according to one embodiment of the present invention.
Figure 6B:
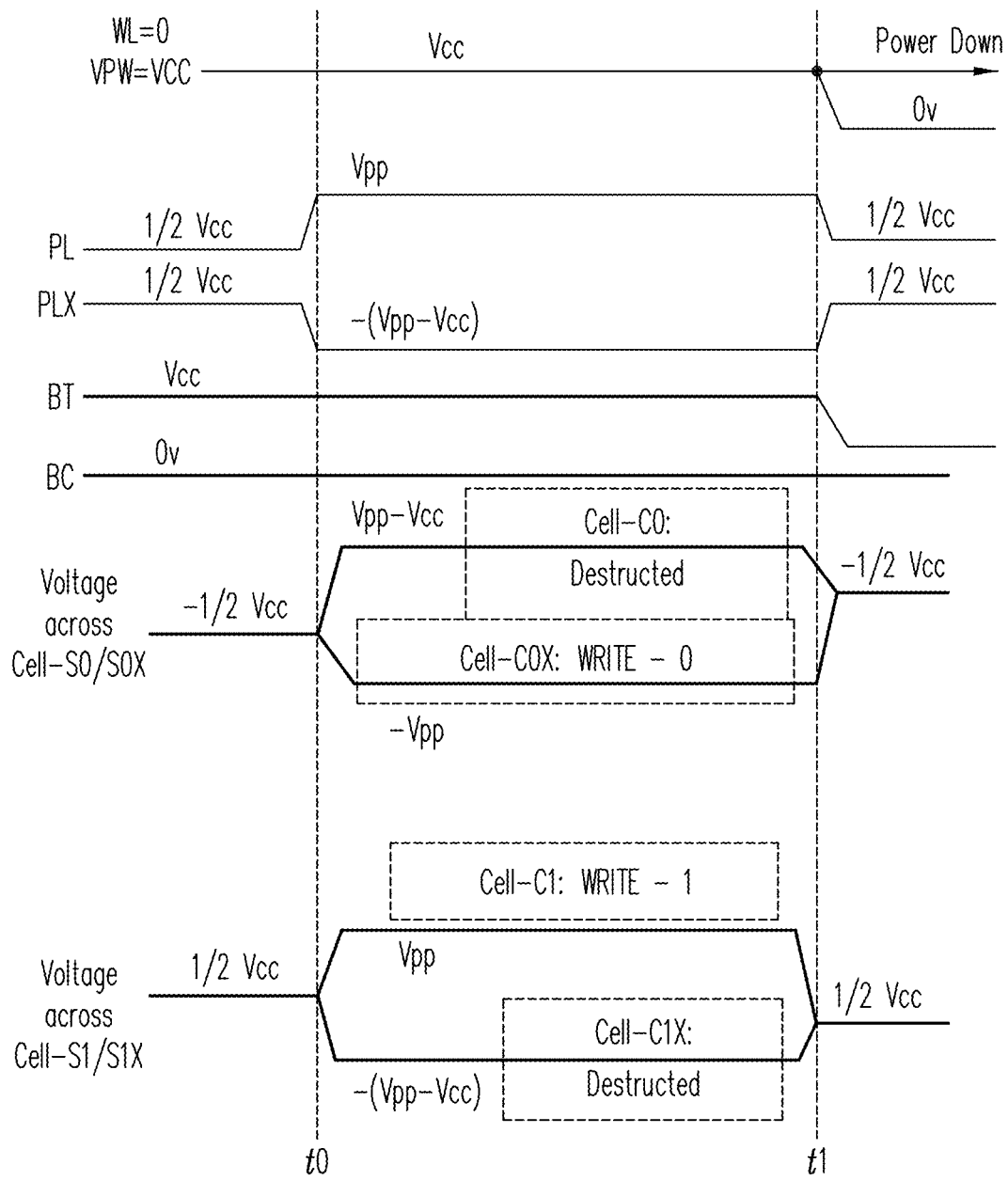
FIG. 6(b) illustrates a write operation on ferroelectric capacitors C0, C0X, C1 and C1X of FeSRAM cell 600, showing the waveforms of plate line signals PL and PLX, data signals BT and BC at data terminals 404a and 404b, and the voltages across ferroelectric capacitors C0, C0X, C1 and C1X, in accordance with one embodiment of the present invention.

With the voltages of plate line signals kept at 0.5 $V_{CC}$ during operations, and with no switching between positive and negative programming voltages in the plate lines during programming of the ferroelectric transistors, access transistors S0 and S1 may be removed. FIG. 6 shows FeSRAM cell 600 without access transistors, according to one embodiment of the present invention. As shown in FIG. 6(a), FeSRAM cell 600 differs from FeSRAM cell 500 of FIG. 5(a) by not having access transistors S0 and S1. FIG. 6(b) illustrates a write operation on ferroelectric capacitors C0, C0X, C1 and C1X of FeSRAM cell 600, showing the waveforms of plate line signals PL and PLX, data signals BT and BC at data terminals 404a and 404b, and the voltages across ferroelectric capacitors C0, C0X, C1 and C1X, in accordance with one embodiment of the present invention. As shown in FIG. 6(b), the write operation for FeSRAM into the ferroelectric capacitors is substantially the same as that described for writing into the ferroelectric capacitors of FeSRAM 500. The advantages of FeSRAM 500 described above are equally applicable to FeSRAM 600.

Figure 7A:
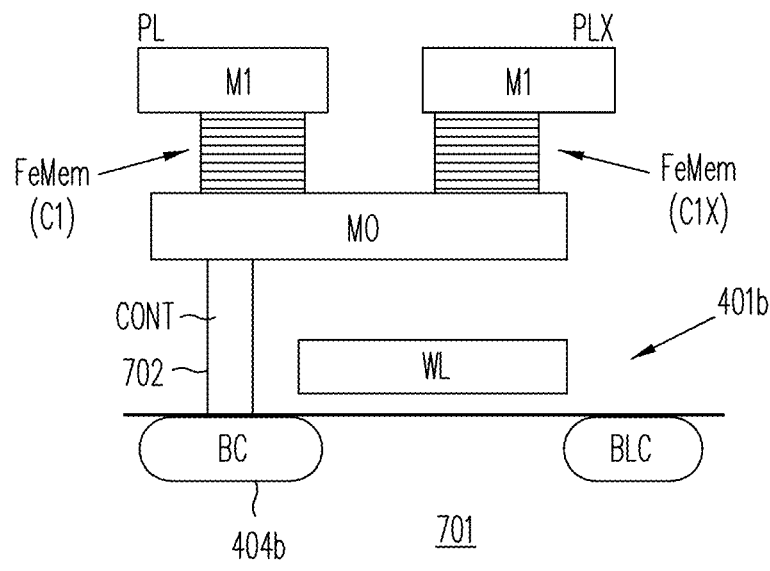
FIG. 7(a) shows that the two plate lines carrying plate line signals PL and PLX of FeSRAM 500 or FeSRAM 600, as well as the ferroelectric capacitors, may be implemented without requiring additional silicon footprint than the conventional six-transistor SRAM cell.

FIG. 7(a) shows that the two plate lines carrying plate line signals PL and PLX, as well as the ferroelectric capacitors, may be implemented without requiring additional silicon footprint than the conventional six-transistor SRAM cell. FIG. 7(a) shows that plate line signals PLX and PL, together with ferroelectric capacitors C1 and C1X, may be provided in the interconnect conductor layers above select transistor 401b that is formed in a silicon substrate 701. In particular, FIG. 7(a) shows the gate and source terminal of transistor 401b receiving word line selection signal WL and data signal BL. Ferroelectric capacitors C1 and C1X are formed between two layers of interconnect conductors M0 and M1 routed above transistor 401b. A common capacitor plate between ferroelectric capacitors C1 and C1X is provided in interconnect conductor layer M0 and is connected to source region 404b of transistor 401b by contact 702, which is the terminal carrying data signal BC. A similar configuration is provided for ferroelectric capacitors C0 and C0X that are formed in like manner above select transistor 401a. Under this arrangement, with transistors 401a, 401b, 402a, 402b, 403a and 403b formed using conventional low-voltage transistors, FeSRAM cell 600 requires substantially the same silicon footprint as a conventional 6-transistor SRAM cell.

Figure 7B:
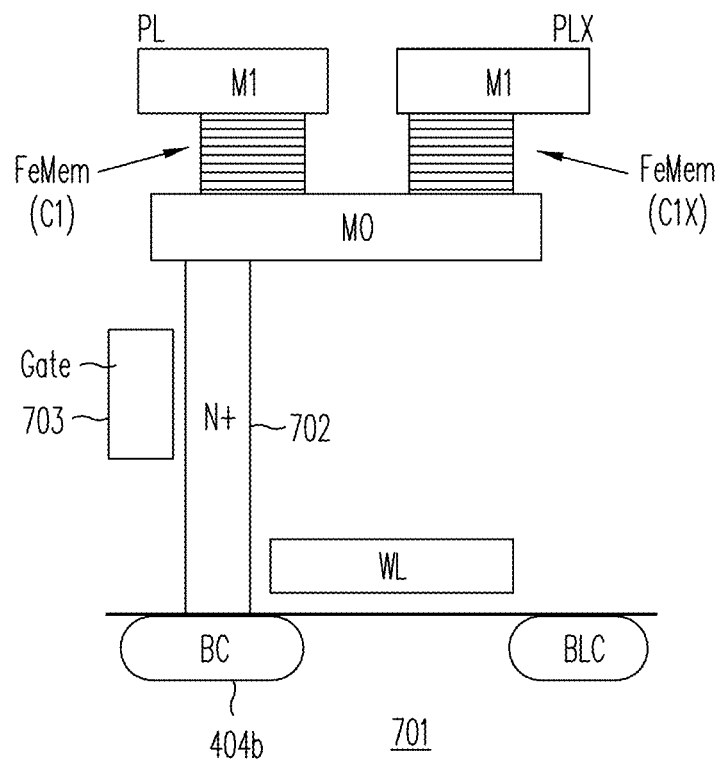
FIG. 7(b) shows, in an implementation of FeSRAM cell 500, access transistor S1 being provided as a thin film transistor, in accordance with one embodiment of the present invention.

For FeSRAM cell 500 of FIG. 5, access transistor S0 and S1 may each be implemented by a thin film transistor (TFT). FIG. 7(b) shows, in one implementation of FeSRAM cell 500, access transistor S1 being provided as a thin film transistor, in accordance with one embodiment of the present invention. As shown in FIG. 7(b), as in FIG. 7(a), ferroelectric capacitors C1 and C1X may be implemented between interconnect conductors above select transistor 401b. However, contact 702, instead of being implemented using conventional conductor material (e.g., a metal silicide), may be implemented by a semiconductor material (e.g., polysilicon). A gate terminal (e.g., gate terminal 703) may be provided to form a vertical TFT in conjunction with contact 702. Under this arrangement, FeSRAM cell 500 requires substantially the same silicon footprint as a conventional 6-transistor SRAM cell.

The above detailed description is provided to illustrate specific embodiments of the present invention and is not to be taken as limiting. Numerous variations and modifications within the scope of the present invention are possible. The present invention is set forth in the accompanying claims.

I claim:

1. A FeSRAM cell, comprising:
   first and second inverters between a power supply voltage and a ground reference cross-coupled to each other, the first and second cross-coupled inverters providing first and second data terminals;
   first and second select transistors respectively coupled to the first and second data terminals to control access to the first second data terminals; and
   first and second ferroelectric capacitors coupled between a first plate line and respectively the first and second data terminals, the first plate line receiving a negative programming voltage having a magnitude greater than the power supply voltage to allow programming one of the first and second ferroelectric capacitors into a first non-volatile programmed state.

2. The FeSRAM cell of claim 1, wherein the first plate line also receives a positive programming voltage to program the other one of the first and second ferroelectric capacitors to a second non-volatile programmed state.

3. The FeSRAM cell of claim 1, wherein each of the first and second ferroelectric capacitors is implemented between interconnect conductor lines routed above one the first and second select transistors.

4. The FeSRAM cell of claim 1, further comprising first and second access transistors coupling the first and second ferroelectric capacitors to the first and second data terminals of the cross-coupled inverters, respectively.

5. The FeSRAM cell of claim 1, further comprising third and fourth ferroelectric capacitors coupled between a second plate line and respectively first and second data terminals of the cross-coupled inverters, the second plate line receiving a positive programming voltage.

6. The FeSRAM cell of claim 5, wherein the first and the third ferroelectric capacitors are implemented between interconnect conductor lines routed above the first select transistor and the second and the fourth ferroelectric capacitors are implemented between interconnect conductor lines routed above the second select transistor.

7. The FeSRAM cell of claim 6, further comprising a first access transistor coupling the first and the third ferroelectric capacitors each to the first data terminal of the cross-coupled inverters and a second access transistor coupling the second and the fourth ferroelectric capacitors each to the second data terminal of the cross-coupled inverters.

8. The FeSRAM of claim 7, wherein the first access transistor comprises a thin film transistor coupled between a source region of the select transistor and a common capacitor plate of the first and third ferroelectric capacitors.

* * * * *